(12) United States Patent
Le Neel et al.

(10) Patent No.: US 9,019,688 B2
(45) Date of Patent: Apr. 28, 2015

(54) CAPACITANCE TRIMMING WITH AN INTEGRATED HEATER

(75) Inventors: Olivier Le Neel, Singapore (SG); Ravi Shankar, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 414 days.

(21) Appl. No.: 13/310,466

(22) Filed: Dec. 2, 2011

(65) Prior Publication Data

US 2013/0141834 A1    Jun. 6, 2013

(51) Int. Cl.
| | |
|---|---|
| H01G 7/04 | (2006.01) |
| H01L 23/522 | (2006.01) |
| H01L 49/02 | (2006.01) |
| H01L 23/34 | (2006.01) |
| H01G 4/33 | (2006.01) |
| H01L 27/06 | (2006.01) |

(52) U.S. Cl.
CPC . *H01G 7/04* (2013.01); *Y10T 29/43* (2015.01); *H01G 4/33* (2013.01); *H01L 23/345* (2013.01); *H01L 23/5223* (2013.01); *H01L 23/5228* (2013.01); *H01L 28/40* (2013.01); *H01L 28/55* (2013.01); *H01L 27/0688* (2013.01); *H01L 2924/0002* (2013.01)

(58) Field of Classification Search
CPC ............. H01G 7/06; H01G 7/00; H01G 7/04; H01G 4/258; H01L 28/40; H01L 23/5223; H01L 23/345; H01L 28/55
USPC ........................................................ 361/282
See application file for complete search history.

(56) References Cited

U.S. PATENT DOCUMENTS

| | | | | |
|---|---|---|---|---|
| 2,648,823 | A | * | 8/1953 | Kock et al. ..................... 332/175 |
| 2,717,356 | A | * | 9/1955 | Foster ............................ 323/370 |
| 2,735,934 | A | * | 2/1956 | Keizer et al. ................... 348/684 |
| 3,083,573 | A | | 4/1963 | Shaw |

(Continued)

FOREIGN PATENT DOCUMENTS

| | | |
|---|---|---|
| EP | 0 822 579 A1 | 2/1998 |
| EP | 1 324 382 A1 | 7/2003 |

(Continued)

OTHER PUBLICATIONS

Boser, "Capacitive Sensor Interfaces," Berkeley Sensor & Actuator Center, Department of Electrical Engineering and Computer Sciences, University of California, Berkeley, California, 40 pages, 1996.

(Continued)

*Primary Examiner* — David M Sinclair
(74) *Attorney, Agent, or Firm* — Seed IP Law Group PLLC

(57) ABSTRACT

The present disclosure is directed to a device and a method for achieving a precise capacitance of a capacitor. The method includes trimming a first capacitance of the capacitor to a second capacitance, the capacitor having a first conductive layer separated from a second conductive layer by a dielectric layer. Changing a first dielectric constant of the dielectric layer to a second dielectric constant, where the first dielectric constant corresponding to the first capacitance and the second dielectric constant corresponding to the second dielectric constant includes heating the dielectric layer above a threshold temperature for a time period. The heat is provided by either one of the plates of the capacitor or from a separate heater.

27 Claims, 7 Drawing Sheets

(56) References Cited

U.S. PATENT DOCUMENTS

| | | | | |
|---|---|---|---|---|
| 3,210,607 | A | * | 10/1965 | Flanagan ........................ 361/103 |
| 3,323,084 | A | * | 5/1967 | Glanc ............................. 334/11 |
| 3,500,243 | A | * | 3/1970 | Polin ........................ 331/107 R |
| 3,854,337 | A | * | 12/1974 | Moran et al. ................... 374/177 |
| 3,971,661 | A | | 7/1976 | Lindberg et al. |
| 4,017,820 | A | * | 4/1977 | Ross ............................. 338/35 |
| 4,217,623 | A | | 8/1980 | Nishino et al. |
| 4,433,319 | A | | 2/1984 | Luder et al. |
| 4,482,882 | A | | 11/1984 | Luder et al. |
| 4,500,940 | A | | 2/1985 | Kuisma et al. |
| 4,532,016 | A | | 7/1985 | Chambaz et al. |
| 4,733,370 | A | * | 3/1988 | Kitajima et al. ............. 365/149 |
| 4,761,710 | A | | 8/1988 | Chen |
| 5,018,395 | A | | 5/1991 | Hickox et al. |
| 5,204,541 | A | | 4/1993 | Smayling et al. |
| 5,262,279 | A | | 11/1993 | Tsang et al. |
| 5,522,980 | A | | 6/1996 | Hobbs et al. |
| 5,640,013 | A | | 6/1997 | Ishikawa et al. |
| 5,643,804 | A | * | 7/1997 | Arai et al. ..................... 438/155 |
| 5,814,726 | A | | 9/1998 | Mitter |
| 6,085,576 | A | | 7/2000 | Sunshine et al. |
| 6,287,750 | B1 | | 9/2001 | Sakurai |
| 6,412,919 | B1 | | 7/2002 | Ghozeil et al. .................. 347/57 |
| 6,448,695 | B2 | | 9/2002 | Milsom |
| 6,467,332 | B1 | | 10/2002 | Bertschi et al. |
| 6,504,226 | B1 | | 1/2003 | Bryant .......................... 257/510 |
| 6,635,585 | B1 | | 10/2003 | Khe et al. |
| 6,649,357 | B2 | | 11/2003 | Bryan et al. |
| 6,806,553 | B2 | * | 10/2004 | Yashima et al. ............. 257/532 |
| 6,821,729 | B2 | | 11/2004 | Ackley et al. |
| 6,883,364 | B2 | | 4/2005 | Sunshine et al. |
| 6,933,807 | B2 | | 8/2005 | Marksteiner et al. |
| 7,071,073 | B2 | | 7/2006 | Villa et al. |
| 7,189,314 | B1 | | 3/2007 | Pace et al. |
| 7,242,569 | B2 | * | 7/2007 | Hunt et al. .................... 361/277 |
| 7,294,536 | B2 | | 11/2007 | Villa et al. |
| 7,364,896 | B2 | | 4/2008 | Schembri |
| 7,368,312 | B1 | | 5/2008 | Kranz et al. |
| 7,594,435 | B2 | | 9/2009 | Sudo |
| 7,651,868 | B2 | | 1/2010 | McDevitt et al. |
| 7,683,891 | B2 | | 3/2010 | Tran |
| 8,079,256 | B2 | | 12/2011 | Langenbacher et al. |
| 8,325,460 | B2 | | 12/2012 | Park et al. |
| 8,363,379 | B2 | * | 1/2013 | Edelstein et al. ............. 361/278 |
| 2003/0062807 | A1 | | 4/2003 | Takeuchi et al. |
| 2003/0201450 | A1 | | 10/2003 | Yamazaki et al. |
| 2004/0172798 | A1 | | 9/2004 | Ruby et al. |
| 2005/0087787 | A1 | * | 4/2005 | Ando ........................... 257/300 |
| 2005/0208696 | A1 | | 9/2005 | Villa et al. |
| 2006/0125489 | A1 | | 6/2006 | Feucht et al. |
| 2006/0171098 | A1 | * | 8/2006 | Won ........................... 361/306.3 |
| 2006/0197118 | A1 | | 9/2006 | Migliorato et al. |
| 2006/0257286 | A1 | | 11/2006 | Adams |
| 2007/0290235 | A1 | | 12/2007 | Lehmann et al. |
| 2008/0265298 | A1 | * | 10/2008 | Ozaki ........................... 257/295 |
| 2010/0073122 | A1 | * | 3/2010 | Le Neel et al. ................ 338/25 |
| 2010/0107739 | A1 | | 5/2010 | Marra |
| 2010/0117127 | A1 | * | 5/2010 | Kumura ........................ 257/295 |
| 2010/0163410 | A1 | | 7/2010 | Mastromatteo et al. |
| 2010/0170324 | A1 | | 7/2010 | Mastromatteo et al. |
| 2011/0051309 | A1 | * | 3/2011 | Furukawa et al. ............ 361/277 |
| 2011/0146400 | A1 | | 6/2011 | Humbert et al. |
| 2011/0179861 | A1 | | 7/2011 | Grange et al. |
| 2011/0209524 | A1 | | 9/2011 | Ziglioli et al. |
| 2011/0318840 | A1 | | 12/2011 | Ziglioli et al. |
| 2012/0168882 | A1 | | 7/2012 | Cherian et al. |
| 2012/0171713 | A1 | | 7/2012 | Cherian et al. |
| 2013/0207673 | A1 | | 8/2013 | Tondokoro et al. |

FOREIGN PATENT DOCUMENTS

| | | | |
|---|---|---|---|
| EP | 1 403 383 A1 | | 3/2004 |
| JP | 04364014 A | * | 12/1992 |
| WO | 2010/006877 A1 | | 1/2010 |
| WO | WO 2011085931 A1 | * | 7/2011 |

OTHER PUBLICATIONS

Holmberg, "Automatic Balancing of Linear AC Bridge Circuits for Capacitive Sensor Elements," IEEE Transactions on Instrumentation and Measurement, 44(3):803-805, Jun. 1995.

Safari et al., "Ferroelectric Ceramics: Processing, Properties & Applications," URL=http://www.rci.rutgers.edu/~ecerg/projects/ferroelectric.html, 38 pages, last modified Aug. 28, 2000.

Sharma et al., "Integration of Precision Passive Components on Silicon for Performance Improvements and Miniaturization," $2^{nd}$ Electronics System-Integration Technology Conference, University of Greenwich, London, United Kingdom, Sep. 1-4, 2008, pp. 485-490.

St. Onge et al., "Design of Precision Capacitors for Analog Applications," IEEE Transactions on Components, Hybrids, and Manufacturing Technology, 15(6):1064-1071, Dec. 1992.

Benetti et al., "Chemical Sensor Based on Thin Film Bulk Acoustic Wave Resonator (TFBAR)," Proceedings of the 10th Italian Conference on Sensors and Microsystems, Firenze, Italy, pp. 326-331, Feb. 15-17, 2005.

Cherian et al., "Chemical Sensor With Replaceable Sample Collection Chip," U.S. Appl No. 13/285,867, filed Oct. 31, 2011, 39 pages.

Cherian et al., "Integrated Chemical Sensor," U.S. Appl. No. 13/285,911, filed Oct. 31, 2011, 56 pages.

Cherian et al., "Single Chip Having the Chemical Sensor and Electronics on the Same Die," U.S. Appl. No. 13/285,894, filed Oct. 31, 2011, 35 pages.

D'amico et al., "Olfactometric Apparatus Based on Oscillating Crystal Sensors Functionalised With Tetrapyrrolic Macrocycles and Provided With Electronics for Conditioning and Reading the Signals, Communicating With a PC, Managing Through a Software and Analysis and Displaying the Data," Italian Patent Application No. RM2001A000455, filed Jul. 26, 2001, 20 pages w/ English translation.

Hwang et al., "CMOS VLSI Potentiostat for Portable Environmental Sensing Applications," IEEE Sensors Journal 10(4):820-821, Apr. 2010.

Kraver et al., "A mixed signal interface microinstrument," Sensors and Actuators A 91:266-277, 2001.

Matsumoto et al., "Influence of Underlayer Materials on Preferred Orientations of Sputter-Deposited AlN/Mo Bilayers for Film Bulk Acoustic Wave Resonators," Japanese Journal of Applied Physics 43(12):8219-8222, 2004.

Richter et al., "A High Performance Silicon Micropump for Fuel Handling in DMFC Systems," proceedings of the Fuel Cell Seminar, Miami Beach, FL, USA, pp. 272-275, Nov. 3-7, 2003.

Rosenbaum, "Bulk Acoustic Wave Theory and Devices," Boston, MA: Artech House, 1988, 7 pages.

Schienle et al., "A Fully Electronic DNA Sensor With 128 Positions and In-Pixel A/D Conversion," IEEE Journal of Solid-State Circuits 39(12):2438-2445, Dec. 2004.

Turner et al., "A CMOS Potentiostat for Amperometric Chemical Sensors," IEEE Journal of Solid-State Circuits, SC-22(3):473-478, Jun. 1987.

Yang et al., "Amperometric Electrochemical Microsystem for a Miniaturized Protein Biosensor Array," IEEE Transactions on Biomedical Circuits and Systems 3(3):160-168, Jun. 2009.

Zhang et al., "Electrochemical Array Microsystem with Integrated Potentiostat," IEEE Sensors, pp. 385-388, 2005.

Dokmeci et al., "A High-Sensitivity Polyimide Capacitive Relative Humidity Sensor for Monitoring Anodically Bonded Hermetic Micropackages," Journal of Microelectromechanical Systems 10(2):197-204, Jun. 2001.

Ford, "The Effect of Humidity on the Calibration of Precision Air Capacitors," Proceedings of the IEE—Part III: Radio and Communication Engineering 96(39):13-16, Jan. 1949.

(56) References Cited

OTHER PUBLICATIONS

Hautefeuille et al., "A MEMS-based wireless multisensor module for environmental monitoring," *Microelectronics Reliability* 48:906-910, 2008.

Hautefeuille et al., "Development of a microelectromechanical system (MEMS)-based multisensor platform for environmental monitoring," *Micromachines* 2.4: 410-430, Nov. 3, 2011.

Laconte et al., "High-Sensitivity Capacitive Humidity Sensor Using 3-Layer Patterned Polyimide Sensing Film," *Proceedings of IEEE Sensors* 1:372-377, 2003.

\* cited by examiner

CAPACITANCE TRIMMING WITH AN INTEGRATED HEATER

BACKGROUND

1. Technical Field

The present disclosure is directed to a device and a method for trimming a capacitor to a precise capacitance, and more particularly, applying heat to alter a dielectric constant of a dielectric layer between parallel plates of the capacitor.

2. Description of the Related Art

A parallel plate capacitor has two conductive plates separated by a dielectric material. The capacitance of the parallel plate capacitor is determined by the following formula:

$$C = \frac{\varepsilon_r \varepsilon_0 A}{d}$$

where C is the capacitance, $\varepsilon_r$ is the dielectric constant (relative permittivity) of the dielectric material between the plates, $\varepsilon_0$ is the electric constant, A is the area of overlap between the plates, and d is the distance between the plates. In order to change the capacitance, the distance between the plates can be changed, the area of overlap can be changed, or the dielectric constant can be changed.

One common technique to change the capacitance of a capacitor in an integrated circuit is laser trimming, for which specific equipment is used to cut away a portion of the capacitor to alter the capacitance. In order to provide for a range of capacitances, the capacitor before trimming is formed over a large area of the silicon substrate. After trimming, any portion of the capacitor that is cut away becomes unused or wasted space.

Laser trimming is performed at wafer level or die level by exposing one of the plates to the laser, which means the capacitance is set before shipment to a consumer. This technique is expensive, utilizes valuable space on the integrated circuit, and does not provide the consumer with flexibility to select the capacitance.

BRIEF SUMMARY

The present disclosure is directed to a method of trimming a capacitor by changing a dielectric constant of a dielectric layer between two plates of the capacitor from a first dielectric constant to a second dielectric constant. The first dielectric constant is the dielectric constant of the dielectric layer when the capacitor is formed. The second dielectric constant is achieved by heating the dielectric layer above a threshold temperature to permanently change the first dielectric constant to the second dielectric constant. The threshold temperature is provided by one of the plates of the capacitor or by a separately formed heater.

The trimming can be performed by the manufacturer before packaging or by the customer after purchase of a device packaged with the capacitor. This allows greater flexibility with the capacitance of the capacitor because a value of the second dielectric will differ based on the time period within which the threshold temperature is applied to the dielectric layer. It also gives more control to the consumer, which allows a wider application of the device to the consumer's needs. In addition, space on a wafer during manufacturing is saved because the dielectric layer is used to control the capacitance of the capacitor as opposed to the area of overlap between the plates or the distance between the plates.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

DETAILED DESCRIPTION

Figure 1:
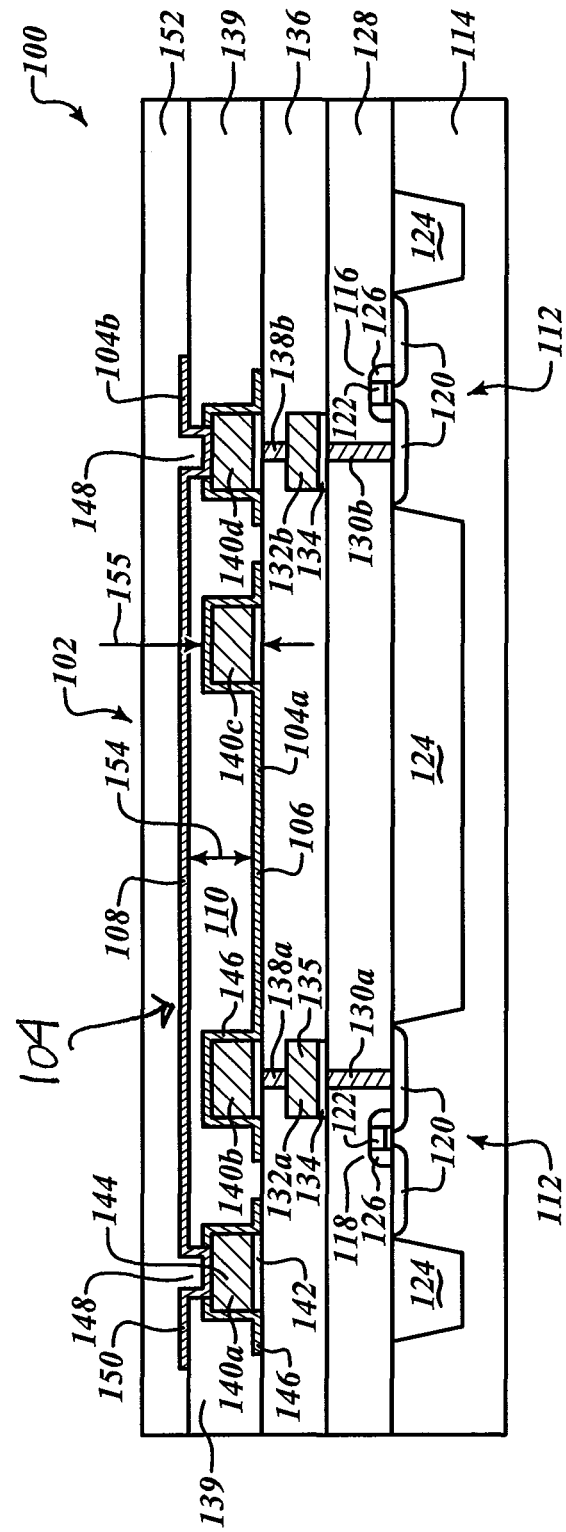
FIG. 1 is a cross-sectional view of a device having a capacitor with an integrated heater according to one embodiment of the present disclosure.

In the following description, certain specific details are set forth in order to provide a thorough understanding of various embodiments of the disclosure. However, one skilled in the art will understand that the disclosure may be practiced without these specific details. In some instances, well-known structures associated with semiconductor manufacturing have not been described in detail to avoid obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

FIG. 1 is a cross-sectional view of a semiconductor device 100 having a capacitor 102 with an integrated heater 104, having portions 104a, 104b. The capacitor 102 includes a first conductive plate 106 and a second conductive plate 108 separated by a first dielectric layer 110. The integrated heater 104a, 104b is configured to change a first dielectric constant of the first dielectric layer 110 to a second dielectric constant to permanently alter the capacitance of the capacitor 102. The integrated heater 104a, 104b is configured to be activated before or after packaging of the semiconductor device, which provides more flexibility and greater control of the ultimate capacitance of the capacitor 102. For example, a consumer could purchase the packaged semiconductor device and then trim the capacitance of the capacitor 102 after the package has been coupled to a printed circuit board. The consumer can select and set a capacitance specific for their intended application by altering the dielectric constant of the first dielectric layer 110 by activating the integrated heater 104a, 104b for a selected time period.

The first dielectric layer 110 is formed from a material that is responsive to heat, such that the first dielectric constant of the first dielectric layer 110 can be changed to the second dielectric constant once a threshold temperature is met for a time period. Bonds in the first dielectric layer 110 change with the application of heat, thereby permanently changing the structure of the first dielectric, changing the first dielectric constant to the second dielectric constant. A value of the second dielectric constant depends on the threshold temperature applied to the dielectric layer 110.

In the embodiment in FIG. 1, the integrated heater 104 is formed from one or both of the conductive plates, i.e., the first conductive plate 106 can be configured to act as the heater 104a or the second conductive plate 108 can be configured to act as the heater 104b, or both. If both the first and second conductive plates 106, 108 are configured to act as heaters, the customer has a wider range of temperatures achievable by the heater 104a, 104b. For example, the first conductive plate may be used as the integrated heater 104a to achieve a first threshold temperature. As an alternative, the second conductive plate may be used as the integrated heater 104b to achieve a second threshold temperature that is higher than the first threshold temperature. In addition, the first and second conductive plates 106, 108 may be used simultaneously to achieve a third threshold temperature that is higher than the first and second threshold temperatures.

FIGS. 1-6 are embodiments of the capacitor 102 having the integrated heater 104 as part of one or both of the conductive plates 106, 108. In other embodiments described herein, the integrated heater is formed separately from the first and second conductive plates, see FIGS. 7-12.

The first dielectric layer 110 may be formed from a variety of materials including, but not limited to, a thin film of lead zirconate titanate (PZT), barium titanate ($BaTiO_3$), or silicon nitride ($Si_3N_4$). These materials have different stable solid phases that depend on the concentrations of elements in the material. For example, varying the concentrations of titanium and zirconium in PZT will cause the first dielectric constant of the material to vary, which impacts the second dielectric constant. Other materials, like barium titanate, have a grain structure that changes in response to the rapid localized thermal processing. The alteration of the grain structure changes the first dielectric constant to the second dielectric constant.

If silicon nitride (SiN) is used, the first dielectric layer 110 can be formed by chemical vapor deposition (CVD) or plasma enhanced chemical vapor deposition (PECVD). When the silicon nitride film is deposited using CVD or PECVD, hydrogen is incorporated or trapped in the films. The entrapped hydrogen in the SiN films influences the electrical properties of the film. Applying heat will alter the amount of hydrogen in the silicon nitride, which alters the dielectric constant.

The capacitor 102 is formed above and coupled to active circuitry 112 formed in and above a semiconductor substrate 114. The semiconductor device 100 includes a plurality of other electronic devices (not shown in this cross section) that are formed in conjunction with the transistors and the capacitor 102 to make the semiconductor device 100 operational. The substrate 114 may be monocrystalline silicon, gallium-arsenide, or an alternative suitable material onto which the device may be formed.

The active circuitry 112 includes a first and a second transistor 116, 118 that each have source/drain regions 120, a gate 122, and sidewall spacers 126 adjacent to the gate 122. The first and second transistors 116, 118 are isolated by various shallow trench isolation structures 124.

A first interlevel dielectric layer 128 overlies the first and second transistors 116, 118. The first interlevel dielectric layer 128 may be a series of deposited layers of various oxides or other insulating material, such as a laminated layer or multiple layers. For example, the first interlevel dielectric may be a premetal dielectric layer, such as borophosphosilicate glass (BPSG), pure silicon dioxide, and tetraethyl orthosilicate (TEOS). The first interlevel dielectric layer 128 may be planarized by a chemical mechanical polish or other technique to remove uneven topology caused by the underlying structures, such as the first and second transistors 116, 118.

A plurality of first conductive plugs 130a, 130b extend through the first interlevel dielectric layer 128 and contact the source/drain regions 120 of the first and second transistors 116, 118. A barrier layer (not shown) may be formed as a protective barrier to line the first conductive plugs 130a, 130b prior to forming a conductive material in the first conductive plugs. For example, the barrier layer may be titanium tungsten or titanium nitride and the conductive material may be tungsten.

A plurality of first interconnect structures 132a, 132b (collectively "132") couple to the conductive plugs 130a, 130b, respectively. The first interconnect structures 132 are conductive layers, such as metal or polysilicon, that carry electrical signals throughout the semiconductor device 100.

In one embodiment, the first interconnect structures 132a, 132b are formed by depositing a barrier layer 134 on the first interlevel dielectric layer 128 and then depositing a metal layer 135 on the barrier layer 134. Then the barrier layer 134 and the metal layer 135 are patterned and etched to form the first interconnect structures 132a, 132b. The first interconnect structures 132a, 132b are formed simultaneously with a plurality of other first interconnect structures that are not visible in this cross section.

The first interconnect structures 132 may be formed using known metal formation techniques. For example, the barrier layer 134 is a 500 to 1,000 angstrom layer of titanium. Other conductive materials may be substituted for or combined with titanium, such as titanium nitride, titanium tungsten, chromium, tantalum nitride, and tantalum silicon nitride. The metal layer 135 may be formed with materials such as aluminum, aluminum copper alloys, copper, or other suitable conductive materials. The metal layer 135 may be formed to have a thickness between 2,000 angstroms and 1 micron. The metal layer 135 is significantly larger than the barrier layer 134. In one embodiment, the barrier layer 134 protects the metal layer 135 from diffusion from other elements in the first interlevel dielectric layer 128 and other layers in the semiconductor device 100.

A second interlevel dielectric layer 136 overlies the first interconnect structures 132a, 132b and may be planarized as described above with respect to the first interlevel dielectric layer 128 using a chemical mechanical polish or other suitable technique. The second interlevel dielectric layer 136 may be an insulating material, such as silicon dioxide, TEOS, or BPSG. The first and second interlevel dielectric layers 128, 136 may include a plurality of layers, such as multiple depositions of the same material or layers of different dielectric materials. The first and second interlevel dielectric layers 128, 136 also isolate the transistors or other components from the capacitor 102 and integrated heater 104a, 104b and other devices formed in the semiconductor device 100.

A plurality of second conductive plugs 138a, 138b extend through the second interlevel dielectric layer 136 to couple the first interconnect structures 132a, 132b, respectively, to some of a plurality of second interconnect structures 140a-d. A first one of the second interconnect structures 140a is not coupled to one of the first interconnect structures 132 in this cross section. A second one of the second interconnect structures 140b couples to the first interconnect structure 132a through the second conductive plug 138a. A third one of the second interconnect structures 140c is not coupled to one of the first interconnect structures 132 in this cross section. A fourth one of the second interconnect structures 140d couples to the first interconnect structure 132b through the second conductive plug 138b.

Each of the second interconnect structures 140a-d are formed with known manufacturing techniques and can include a barrier layer 142 on the second interlevel dielectric layer 136 and a metal layer 144 on the barrier layer 142. Once the metal layer 144 and the barrier layer 142 are patterned and etched to form the second interconnect structures 140a-d, the first conductive plate 106 is formed.

An antireflective coating (not shown) can overlie the first or second interconnect structures 132, 140. The antireflective coating is optional and can be omitted. A protective coating (also not shown) may be included on the antireflective coating or directly on the first or second interconnect structures 132, 140 to protect a top surface of the first or second interconnect structures from overetch.

Each of the first and second conductive plates 106, 108 are thin film layers laterally connecting respective ones of the second interconnect structures 140a-d. In particular, the first conductive plate 106 laterally connects the second and the third ones of the second interconnect structures 140b, 140c and the second conductive plate 108 laterally connects the first and fourth ones of the second interconnect structures 140a, 140d. A first thin film layer 146 is then patterned and etched to separate the first conductive plate 106 from the excess portions of the first thin film layer 146 over the first and fourth ones of the second interconnect structures 140a, 140b.

The first conductive plate 106 is formed by deposition of the first thin film layer 146 over the second interlevel dielectric 136 and the second interconnect structures 140a-d. The first thin film layer 146 directly contacts the second interconnect structures on the tops and sidewalls. This eliminates the need to form vias to connect the first thin film layer to the next metal or conductive layer, which makes the semiconductor device smaller overall. This significantly reduces manufacturing time and costs by reducing the processing steps and reducing the amount of materials used to complete the semiconductor device 100. Also, the overall vertical and horizontal dimensions of the semiconductor device are decreased.

The first thin film layer 146 remains on sidewalls of the second interconnect structures 140a-d. In some other embodiments, vertical portions of the first thin film layer 146 do not remain in the final product. Their existence depends on how the manufacturer decides to pattern and form the first conductive plate 106 and how openings 148 are formed to access the first and fourth second interconnect structures 140a, 140d.

An etch to remove portions of the first thin film layer 146 may over etch and remove some amount of the exposed second interlevel dielectric 136. The over etch may occur to ensure the excess portions of the first thin film layer 146 are removed, thereby avoiding shorting adjacent ones of the second interconnect structures 140a-d that are not intended to be electrically connected.

Leaving the first thin film layer 146 on the sidewalls protects the second interconnect structures 140a-d from under etch when the first conductive plate 106 is defined and portions of the second interlevel dielectric 136 are reexposed. If there is misalignment when defining the first conductive plate 106 or forming the openings 148, the protective layer (not shown, but discussed above) can be useful in preventing the etch chemistry from damaging the second interconnect structures 140a-d.

Numerous materials may be utilized to form the first thin film layer 146, including, but not limited to, metallic films like chromium silicon, nickel chromium, tantalum nitride, tantalum aluminum, titanium nitride, and platinum, to name a few. These materials also offer good performance as capacitive plates and as resistors, which can be used to provide the thermal processing to change the first dielectric constant of the first dielectric layer 110 to the second dielectric constant.

These materials can form a wide range of sheet resistances, have good tolerance, are easily reproducible, have low temperature coefficients of resistance, have linear behavior, and have low parasitic capacitance values. These resistive materials are generally formed by an evaporation technique, a sputter technique, or a chemical vapor deposition technique.

The first thin film layer 146 that forms the first conductive plate 106 may be formed to have a thickness of less than 100 angstroms. In other embodiments, the first conductive plate may have a thickness in the range of 50 and 500 angstroms. With these small thicknesses, the first conductive plate can be formed between adjacent ones of the second interconnect structures 140a-d without negatively impacting the interlevel dielectric planarization of subsequent levels in the semiconductor device 100.

After the thin film layer 146 is deposited, a hard mask may be deposited to permanently protect the thin film resistor. For example, a titanium tungsten barrier layer may be deposited. The hard mask will protect the thin film resistor from chemically reacting with subsequent insulation, interlevel dielectric, or passivation layers. In locations where vias are formed, the hard mask can be removed with a wet etch, such as with hydrogen peroxide.

The first dielectric layer 110 is deposited on the first conductive plate 106. In some embodiments, the first dielectric layer 110 remains over the entire substrate, i.e., it is not patterned and removed from some locations. In other embodiments, the first dielectric layer 110 is patterned and etched so that the first dielectric layer 110 is only between the first and second conductive plates. A second dielectric layer 137 (not shown in FIG. 1, see FIG. 3) with different properties than the first dielectric layer 110 can be deposited over the second interlevel dielectric 136 that is not be covered by the capacitor or extended portions of the second conductive plate 108. For example, the second dielectric layer 137 would be deposited at locations 139 on the second interlevel dielectric 136, such that the first dielectric layer 110 is located only between the first and fourth ones of the second interconnect structures 140a, 140d.

The first dielectric layer 110 may be planarized, such as by CMP or other process to remove uneven topology. The openings 148 are formed through the first dielectric layer 110 over the first and fourth ones of the second interconnect structures 140a, 140d and through the excess first thin film layer 146 on top of the first and fourth ones of the second interconnect structures 140a, 140d.

A second thin film layer 150 is deposited over the first dielectric layer 110 and in the openings 148. The second thin film layer 150 is electrically connected to the first and fourth ones of the second interconnect structures 140a, 140d. The second thin film layer 150 is patterned and etched to form the second plate 108 of the capacitor 102. The second thin film layer 150 may be formed of the same materials described above with respect to the first thin film layer 146. In this embodiment, both of the first and second conductive plates 106, 108 can be utilized as the integrated heater 104a, 104b.

In one embodiment, the first thin film layer 146 is a chromium silicon film that is 10 nanometers thick that includes a 30 nanometer cap of silicon nitride, and the second thin film layer is a 20 nanometer thick tantalum aluminum layer. The second interconnect structures 140a-d may be a 50 nanometer thick titanium nitride barrier with a 1 micron thick aluminum silicon copper layer.

A third interlevel dielectric 152 is formed over the second conductive plate 108. Other conductive plugs and interconnect structures may be formed to connect the capacitor 102 to contacts and other components in the semiconductor device 100.

In an alternative embodiment, the first and second thin film layers 146, 150 may be formed by depositing multiple thin film layers in succession. A stack of thin film layers combine the elementary properties of the individual layers. The first and second thin film layers 146, 150 may be deposited with multiple deposition steps in a single physical vapor deposition machine, without a break in vacuum conditions.

Figure 2:
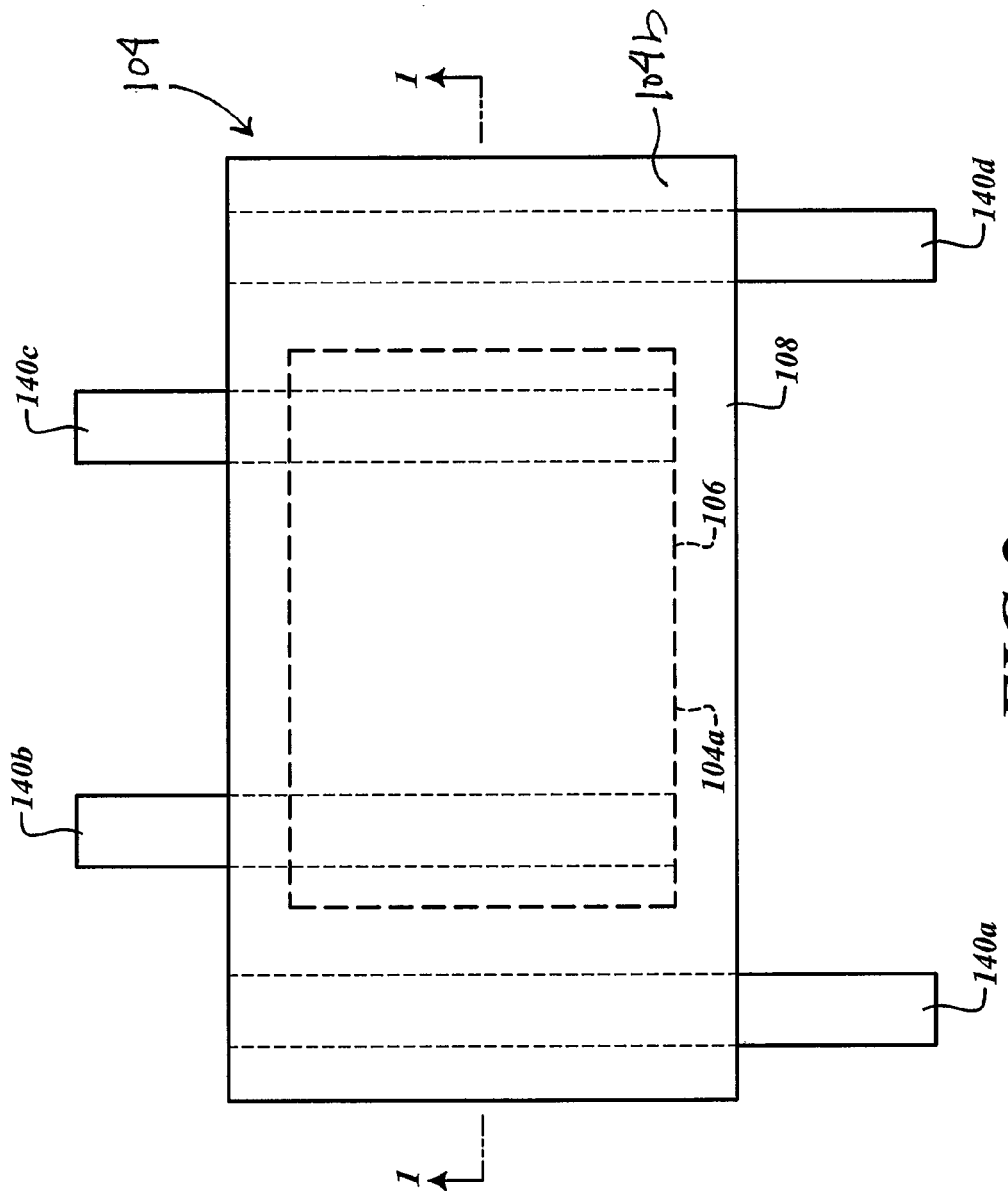
FIG. 2 is a simplified top down view of the capacitor and integrated heater of FIG. 1.

FIG. 2 is a simplified top down view of the first and second conductive plates 106, 108 with the second interconnect structures 140a-d of FIG. 1. FIG. 1 is a cross section taken through FIG. 2 at 1-1.

In one embodiment, the first conductive plate 106 is used as the integrated heater 104a because the area of overlap that determines the capacitance of the capacitor 102 is based on a surface area of the smallest electrode, in this case the first conductive plate 106, which is smaller than a surface area of the second conductive plate 108. More particularly, the capacitance of the capacitor 102 is determined by the area of overlap between the first and second plates 106, 108, a distance 154 between the plates, and the dielectric constant ($\in_r$). From the perspective of what portion of the first dielectric layer 110 to heat, only the portion that corresponds to the first conductive plate 106 will have an impact on the ultimate capacitance of the capacitor 102 because of the area of overlap.

The portion of the first dielectric layer 110 that corresponds to the first conductive plate 106 will have the first dielectric constant after manufacturing or deposition. Subsequently, before or after packaging, the integrated heater 104a of the first conductive plate 106 is activated to provide thermal processing of the first dielectric layer 110 to change the first dielectric constant to the second dielectric constant. Focusing the heat to a localized heat treatment associated with the area or portion of the first dielectric layer 110 that determines the capacitance of the capacitor 102 avoids damaging adjacent components during the heat treatment.

In other embodiments, the surface area of the first and second conductive plates 106, 108 may be equal, which would allow for one or both of the integrated heaters 104a, 104b of the first and second conductive plates 106, 108, respectively, to be utilized to change the first dielectric constant to the second dielectric constant. Also, different arrangements described herein of the first and second conductive plates 106, 108 allow for changes in the distance 154 between the plates.

In the embodiment of FIG. 1, the distance 154 is limited by a height 155 of the second interconnect structures 140a-d with the first thin film layer 146. Other embodiments are described herein that provide greater control of the distance 154.

Figure 3:
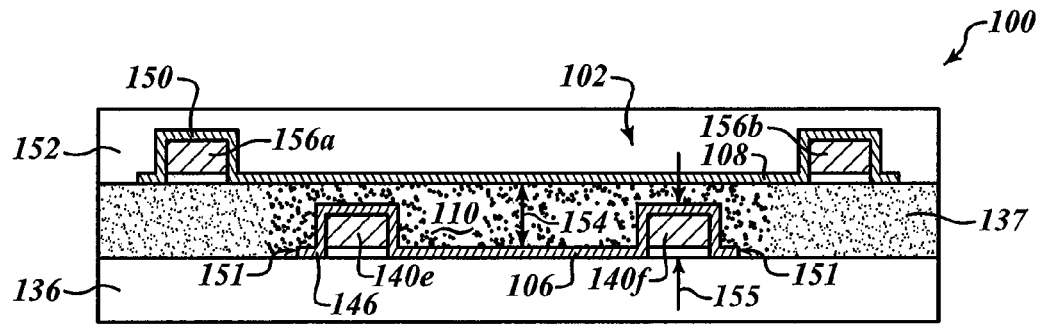
FIGS. 3-6 are cross-sectional views of alternative configurations of capacitors having integrated heaters according to various embodiments of the present disclosure.
Figure 4:
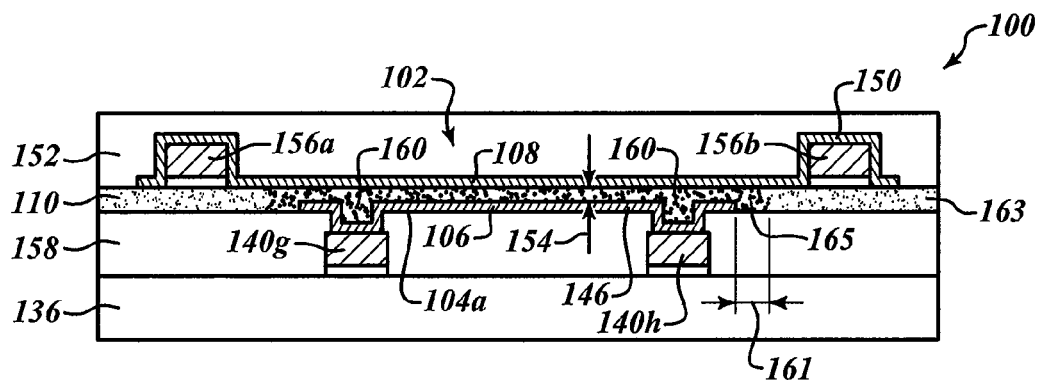
Figure 5:
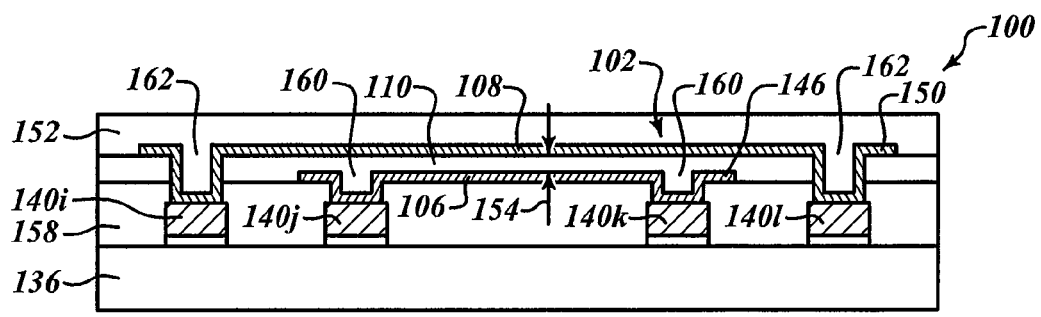

FIGS. 3, 4, and 5 are alternative arrangements of the first and second conductive plates 106, 108 of the capacitor 102 of FIG. 1 that have the same top down view as shown in FIG. 2. The variations in arrangement include forming the first and second conductive plates 106, 108 on different levels of the semiconductor device and adjusting the distance 154 between the first and second plates 106, 108. For simplicity, the conductive plugs 130, 138 from the transistors 116, 118 and the first interconnect structures 132 are not shown in FIGS. 3, 4, and 5. The variations are in how the second interconnect structures 140 and the first and second conductive plates 106, 108 are formed.

In FIG. 3, the capacitor 102 includes the first conductive plate 106 separated from the second conductive plate 108 by the dielectric layer 110. The first conductive plate 106 laterally connects two of the second interconnect structures 140e, 140f. The second conductive plate 108 laterally connects two third interconnect structures 156a, 156b formed on a separate level from the second interconnect structures 140e, 140f.

The first conductive plate 106 is patterned and etched from the first thin film layer 146 over the second interconnect structures 140e, 140f and the second interlevel dielectric 136. The first dielectric layer 110 is deposited over the first conductive plate 106 and acts as the dielectric between the first and second plates 106, 108 of the capacitor 102. The first dielectric layer 110 is planarized to form a planar surface onto which third interconnect structures 156a, 156b are formed in accordance with known techniques. The second conductive plate 108 is patterned and etched from the second thin film layer 150 that was deposited over the first dielectric layer 110 and third interconnect structures 156a, 156b. Then the third interlevel dielectric 152 is formed over the second conductive plate 108.

In the embodiment in FIG. 3, the first dielectric layer 110 is more easily constrained to the area over the first conductive plate 106 because only the second interconnect structures 140e, 140f are formed, i.e., only two of the second interconnects structures are formed instead of four as in FIG. 1. More particularly, portions of the first dielectric layer 110 that extend past edges 151 of the first conductive plate 106 may be removed, such as by etching. The second dielectric layer 137 is then deposited over the reexposed portions of the second interlevel dielectric 136.

As with FIG. 1, the distance 154 is limited by the height 155 of the second interconnect structures 140e, 140f plus the thickness of the first conductive plate 106. FIG. 4 shows an alternative embodiment where the distance 154 is not constrained by the height 155.

FIG. 4 is an alternative embodiment of the capacitor 102 of FIGS. 1 and 2. As with FIG. 3, the first and second conductive plates 106, 108 are formed on different levels of the semiconductor device 100. The second interconnect structures 140g, 140h are formed on the second interlevel dielectric 136. A fourth interlevel dielectric 158 is formed over the second interconnect structures 140g, 140h. The fourth interlevel dielectric layer 158 may be planarized to remove uneven topography.

Openings 160 are formed through the fourth interlevel dielectric 158 to reexpose portions of the second interconnect structures 140g, 140h. The first thin film layer 146 is then deposited, patterned, and etched to form the first conductive plate 106 that connects to the second interconnect structures 140g, 140h through the openings 160.

The first dielectric layer 110 is deposited over the first conductive plate 106. The distance 154 associated with a thickness of the first dielectric layer 110 can be selected to control the capacitance of the capacitor 102. The first dielectric layer 110 may be planarized to change the thickness and to remove any uneven topology.

The third interconnect structures 156c, 156d are formed over the dielectric layer 110. Then the second conductive plate 108 is formed from the second thin film layer 150 over the third interconnect structures 156c, 156d and the first dielectric layer 110.

The capacitance of the capacitor 102 is determined by the area of overlap of the first and second conductive plates 106, 108, the distance 154 between the plates, and the dielectric constant of the first dielectric layer 110. In this embodiment, the distance 154 is controllable during manufacturing and the dielectric constant is changeable during or after manufacturing.

In FIG. 4, the first conductive plate 106 is configured to act as the integrated heater 104a. The dielectric layer 110 includes a first portion 163 that has the first dielectric constant and a second portion 165 that has the second dielectric constant. During the thermal processing of the first dielectric layer 110, the integrated heater 104a produces localized heating such that the high temperatures used to change the second portion 165 from the first dielectric constant to the second dielectric constant is constrained to within a distance 161 from the first conductive plate 106. This localized thermal processing protects other components in the device 100 from damage from this heat.

FIG. 5 is yet another configuration of the first and second plates 106, 108 of the capacitor 102. In this embodiment, four of the second interconnect structures 140i-l are formed over the second interlevel dielectric 136. The fourth interlevel dielectric 158 is formed over the second interconnect structures 140i-l prior to forming the first thin film layer 146. Two of the openings 160 are formed through the fourth interlevel dielectric 158 to reexpose portions of the second and third ones of the second interconnect structures 140j and 140k.

The first conductive plate 106 is formed from the first thin film layer 146 over the fourth interlevel dielectric 158 and couples to the second and third ones of the second interconnect structures 140j and 140k through the openings 160. The first dielectric layer 110 is formed over the first conductive plate 106 and the fourth interlevel dielectric 158.

The distance 154 between the first and second conductive plates 106, 108 is dictated by the thickness of the dielectric layer 110. With the arrangement of FIG. 5, the distance 154 can easily be varied and is not constrained by the height of interconnect structures.

Second openings 162 are formed through the first dielectric layer 110 and the fourth interlevel dielectric 158 over the first and fourth ones of the second interconnect structures, 140i, 140l. The second conductive plate 108 couples to the first and fourth ones of the second interconnect structures 140i, 140l through the second openings 162 and is formed on the dielectric layer 110. The third interlevel dielectric 152 may be formed over the second conductive plate 108.

Figure 6:
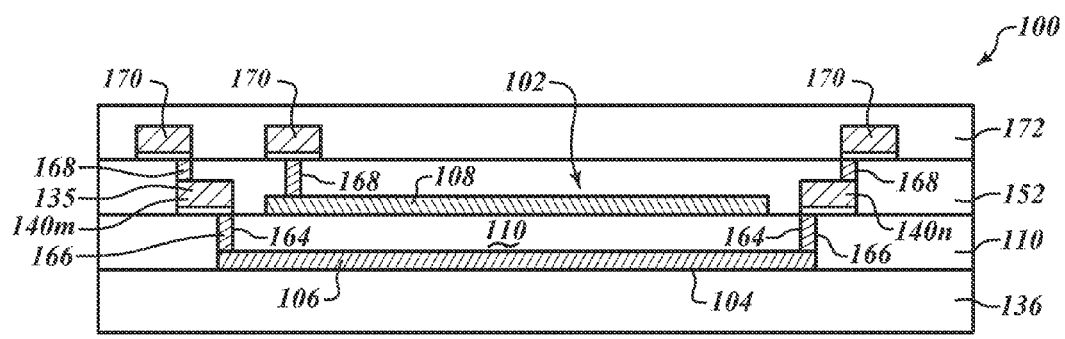

FIG. 6 is yet another embodiment of the capacitor 102 of the semiconductor device 100 where the first and second conductive plates 106, 108 are formed with an alternative method. In particular, the first conductive plate 106 is formed before forming the second interconnect structures 140m, 140n. The first conductive plate 106 is a high k or high thermal conductivity material that is configured to also act as the heater 104 during the trimming process to change the first dielectric constant of the first dielectric layer 110 to the second dielectric constant. For example, the first conductive plate 106 may include tantalum aluminum.

Once the first conductive plate 106 is patterned and etched, the first dielectric layer 110 is formed. Openings 164 are formed through the first dielectric layer 110 to reexpose portions of the first conductive plate 106. Conductive plugs 166 are formed in the openings 164 to provide an electrical connection from the first conductive plate 106 to control circuitry (not shown).

The second interconnect structures 140m, 140n are coupled to the conductive plugs 166 and are adjacent to the second conductive plate 108. The second conductive plate 108 may be formed from aluminum, which can also be used for the metal layer 135 of the second interconnect structures 140m, 140n, i.e., the second conductive plate 108 and the second interconnect structures 140m, 140n may be formed at the same time. However, in other embodiments, the second interconnect structures 140m, 140n are formed in separate process steps from the second conductive plate 108.

Once the second interconnect structures 140m, 140n and the second conductive plate 108 have been formed, the third interlevel dielectric 152 is formed. Conductive plugs 168 are formed in the third interlevel dielectric 152 to provide connections to the second conductive plate 108 and the second interconnect structures 140m, 140n. A plurality of third interconnect structures 170 are formed on the third interlevel dielectric 152 to provide electrical connections to the first and second conductive plates 106, 108. The third interconnect structures 170 connect the first and second conductive plates 106, 108 to control circuitry (not shown). A fourth interlevel dielectric 172 covers the third interconnect structures 170.

In this embodiment, the second conductive plate 108 is only used as the second plate of the capacitor and is not configured to act as the integrated heater. Accordingly, the second conductive plate 108 has a single conductive plug 168 to provide a voltage to the plate.

In one embodiment, specific materials are used for the second, third, and fourth interlevel dielectric layers 136, 152, 172 to constrain the heat from the heater 104 to the first dielectric layer 110 to avoid damaging any other components in the semiconductor device 100 during thermal processing of the dielectric layer 110. In particular, using low k or low thermal conductivity materials will prevent the heat from flowing through the second, third, and fourth interlevel dielectric layers 136, 152, 172 away from the heater 104. The substrate 114 is a high k or high thermal conductivity material. In addition, the first and second conductive plates 106, 108 are high k materials. For example, the first conductive plate 106 is a tantalum aluminum layer, which is also configured to act as the integrated heater 104 and the second conductive plate 108 is an aluminum layer. Accordingly, the first, second, third, and fourth interlevel dielectric layers 128, 136, 152, 172 should be low k or low conductivity materials, such as silicon dioxide, to prevent heat dissipation away from the heater 104 and through the first and second conductive plates 106, 108.

In this embodiment, the first and second conductive plates 106, 108 may be formed from thicker layers than the thin film layers described above with respect to FIGS. 1-5. In particular, the first and second conductive plates 106, 108 may be in the range of 0.5 to 1 micron in thickness.

In the embodiment of FIG. 6, or other embodiments, the heater may also be formed in the substrate 114 (see FIG. 1 for the substrate 114). The channel regions of a transistor will heat to a certain temperature when the transistor is turned on. In addition, if a resistor is formed in the substrate from monocrystalline silicon, it also will heat to a selected temperature when current passes through it. Accordingly, the silicon substrate itself can be used as the heater. Alternatively, a thin film transistor formed of polysilicon can also be used as the heater. See, for example, U.S. Pat. Nos. 6,504,226 and 6,412,919 for examples of various types of such heaters. In these embodiments, the plates 106 and 108 act merely as electrodes of the capacitor, and the heater is provided in silicon.

Figure 7:
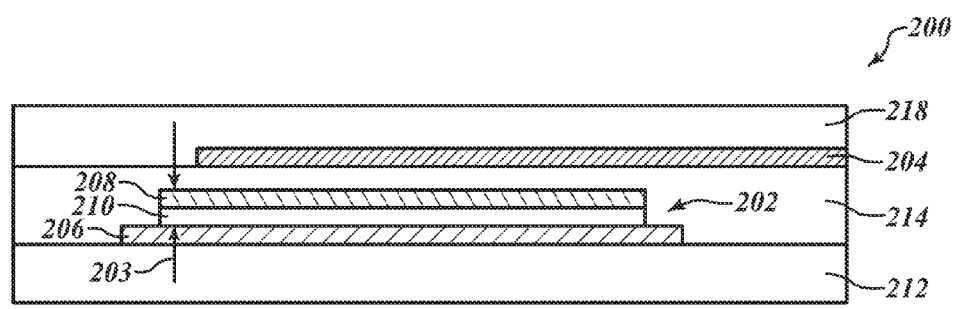
FIG. 7 is a cross-sectional view of a capacitor and a heater according to another embodiment of the present disclosure.

FIG. 7 is an alternative embodiment of a semiconductor device 200 having a parallel plate capacitor 202 having an integrated heater 204 separate from the capacitor 202 according to an embodiment of the present disclosure. The capacitor includes a first conductive plate 206 separated from a second conductive plate 208 by a dielectric layer 210.

The semiconductor device 200 includes active circuitry and other components, such as those shown in FIG. 1. For simplicity, the active circuitry and other components, which are formed with various process steps and include a plurality of interlevel dielectric layers, are not shown in FIG. 7. However, first interlevel dielectric layer 212 is representative of these previously formed layers and features that are not shown. The first interlevel dielectric layer 212 is planarized by CMP or other process to remove any uneven topology.

Both the first and the second conductive plates 206, 208 are formed by depositing, patterning, and etching a metal, polysilicon, or other conductive layer. The first and second conductive plates 206, 208 are not formed from the thin film processing techniques described above with respect to FIGS. 1-5. The first and second plates 206, 208 are larger. For example the first conductive plate may be in the range of 400 and 800 nanometers and the second conductive plate may be in the range of 150 and 450 nanometers. As described above, a thickness 203 of the dielectric layer 210 can be varied to alter the ultimate capacitance of the capacitor 202.

After depositing, patterning, and etching the first conductive plate 206, the dielectric layer 210 is deposited over the first conductive plate and the first interlevel dielectric 212. The dielectric layer 210 is configured to be trimmable from a first dielectric constant to a second dielectric constant with the application of heat from the heater 204. The dielectric layer 210 is formed from the materials discussed above with respect to FIG. 1.

The conductive layer used to form the second conductive plate 208 is deposited over the dielectric layer 210. Then the second conductive plate 206 and the dielectric layer 210 are patterned and etched together so that the first conductive plate 208 has a larger surface area than the dielectric layer 210 and the second conductive plate 208. In other embodiments, the first and second conductive plates 206, 208 and the dielectric layer 210 all have the same surface area and are patterned using the same mask, see FIG. 9.

The first and second conductive plates 206, 208 may be formed of the same conductive material or of different types of conductive material. In addition, each of the first and second conductive plates may be formed of a single layer or of a plurality of conductive layers. For example, the first and second conductive plates 206, 208 may have aluminum with titanium barrier layers.

In one embodiment, the first conductive plate 206 may be formed simultaneously with the second interconnect structures 140 described above with respect to FIG. 1. Accordingly, the first conductive plate 206 includes the barrier layer 134 and the metal layer 135, where the barrier layer 134 includes a titanium layer under a titanium nitride layer and the metal layer 135 includes aluminum. The first conductive plate 206 includes a cap of titanium and titanium nitride and the second conductive plate 208 includes a layer of aluminum followed by a layer of titanium, titanium nitride, and an antireflective coating.

A second interlevel dielectric 214 is formed over the capacitor 202 once the second conductive plate 208 and the dielectric layer 210 are patterned and etched. The integrated heater 204 is formed from a conductive material layer that is deposited, patterned, and etched. A third interlevel dielectric 218 is formed over the heater 204. The second and third interlevel dielectrics 214, 218 may be any suitable interlevel dielectric layer, such as the ones discussed above with respect to FIG. 1.

Figure 8:
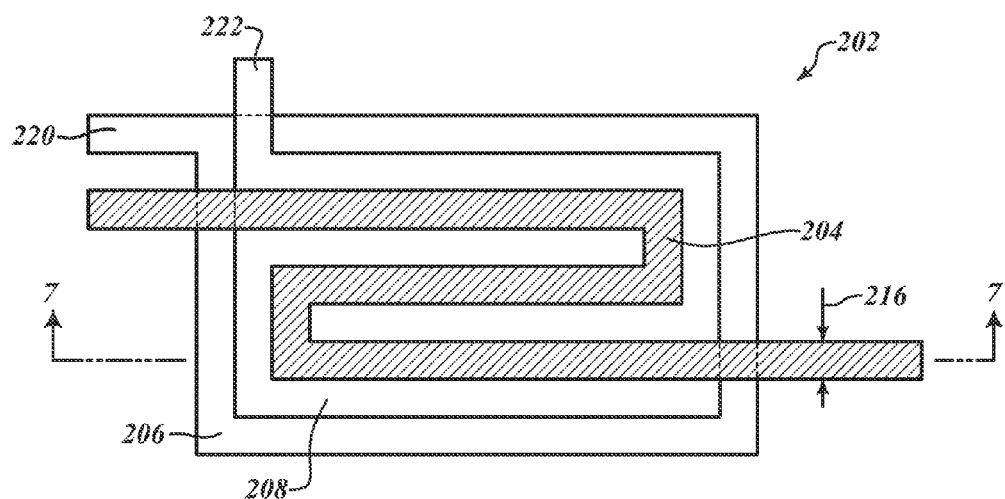
FIG. 8 is a top down view of the capacitor and the heater of FIG. 7.

FIG. 8 is a top down view of the capacitor 202 and the heater 204 of FIG. 7. The first plate 206 of the capacitor 202 has a larger surface area than the second plate 208. The dielectric layer 210 is not visible in FIG. 8 because the dielectric layer 210 has the same dimensions as the second conductive plate 208. Both the first and second conductive plates 206, 208 have conductive traces 220, 222, respectively that are configured to couple to control circuitry, such as the transistors 116, 118 of FIG. 1. Voltage is supplied to the first and second conductive plates 206, 208 through the conductive traces 220, 222, respectively.

In this embodiment, the heater 204 is a serpentine shape having a width 216 that is consistent throughout. The heater 204 is configured to generate localized heat to alter the dielectric constant of the dielectric layer 210. When deposited, the dielectric layer 210 has a first dielectric constant. After application of heat above a threshold, the first dielectric constant is changed to a second dielectric constant that remains after the heat is removed.

In one embodiment, applying a 25 milliamp current to the heater 204 will generate a localized increase in temperature to above 600 degrees Celsius. With a 1 micron thick lead zirconate titanate film, also called PZT, is used for the dielectric material 210 in a 200 by 200 micron area of the parallel plate capacitor 202, the capacitance of the capacitor 202 changed by 0.15 to 0.2 nanofarads. Prior to application of heat, the first dielectric constant is 500. After a first application of heat in the range of 600 and 650 degrees Celsius, the dielectric constant is changed to the second dielectric constant, such as 1000.

The material PZT can have a dielectric constant that varies from a low of 300 to a high of about 4000 depending on orientation, doping, and formation properties. The PZT material can have starting dielectric constant in the low range, 300-400, and then upon a first heating, double to over 800. Upon subsequent heatings, it can increase more, to over 2000 or 3000. By careful application of heat, the dielectric constant can be moved from a first value to a desired second value, with custom increases in the range of 10%, 20%, 50%, 100%, 200%, etc., possible depending on the amount of time over which heat is applied and the temperature it reaches.

In embodiments where the dielectric material 210 is PECVD silicon nitride and the heater 204 is a chromium silicon resistor, the resistance of the heater 204 changes as the temperature changes. With these materials, the resistance of the heater 204 decreases with a sharper decrease in resistance occurring around 350 degrees Celsius. As the resistance of the heater 204 is decreasing, the change in the capacitance or dielectric constant begins to increase. For example, the change in the dielectric constant for silicon nitride increases between the temperatures of 335 to 394 degrees Celsius. Accordingly, the ultimate capacitance of the capacitor 202 may be selected by controlling the temperature applied during the trimming.

In some embodiments, the current through the heater 104 is pulsed as opposed to a steady flow of current. If the dielectric material 210 is PECVD silicon nitride, a frequency of 300 kilohertz for the pulse achieves a greater change in the capacitance of the capacitor 202, i.e., provides the greatest change of the dielectric constant from the first dielectric constant to the second dielectric constant. The pulse can be used to create a range of temperature to change the dielectric constant. For example, if the capacitor 202 has a capacitance of 0.3605 picofarads before the application of heat and the heater 204 is activated to provide around 250 degrees Celsius with a pulse of 300 kilohertz, the capacitance can be changed to 0.3755 picofarads. In another example, if the capacitor 202 has a capacitance of 0.3350 picofarads before the application of heat and the heater 204 is activated to provide around 392 degrees Celsius with a pulse of 300 kilohertz, the capacitance can be changed to 0.3455 picofarads. The amount of heat and time of heat application can be custom selected to vary the dielectric constant towards a target value.

Figure 9:
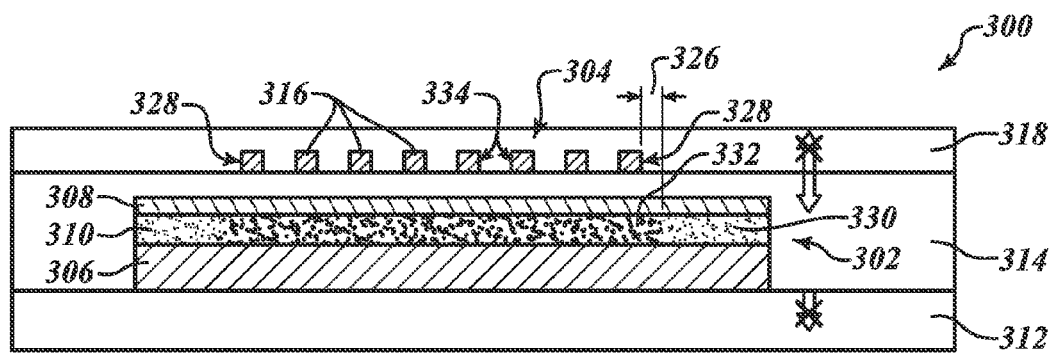
FIG. 9 is a cross-sectional view of a capacitor and a heater according to another embodiment of the present disclosure.
Figure 10:
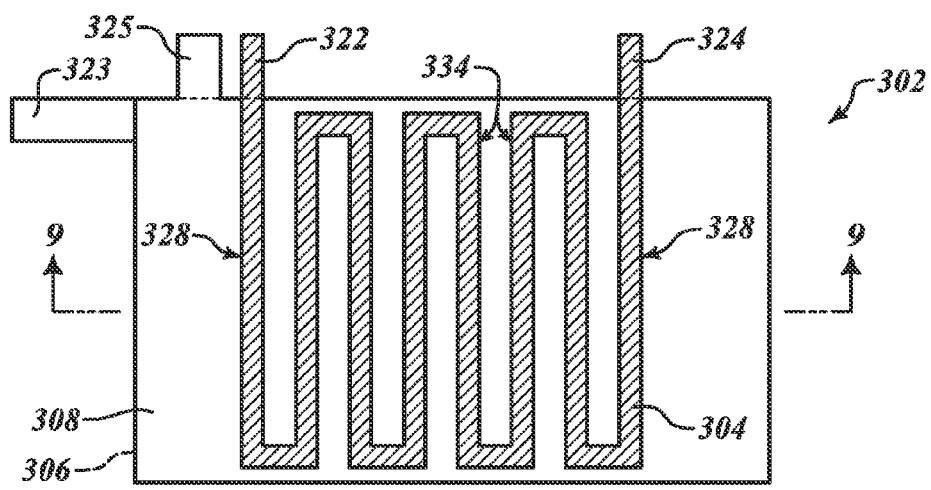
FIG. 10 is a top down view of an alternative arrangement of the heater of FIG. 9.

FIGS. 9 and 10 are cross-sectional and top down views, respectively, of an alternative embodiment of a semiconductor device 300 having a capacitor 302 and an integrated heater 304 formed in accordance with the present disclosure. As with the semiconductor device 200 in FIG. 7, the semiconductor device 300 includes active circuitry and other components, not shown in the cross section of FIG. 9. A first interlevel dielectric 312 represents a plurality of layers that can include control circuitry and other components.

The capacitor 302 includes a first conductive plate 306 separated from a second conductive plate 308 by a dielectric layer 310. In this embodiment, the first conductive plate 306 is thicker than the second conductive plate 308; however, the first and second conductive plates 306, 308 may be the same thickness or the second conductive plate may be thicker than the first conductive plate. In this embodiment, the first conductive plate 306, the dielectric layer 310, and the second conductive plate 308 are deposited consecutively and then patterned and etched as a group. In some embodiments, a plurality of different etches may be used to remove the three different layers.

The first and second conductive plates 306, 308 each have a single contact 323, 325, configured to provide voltage to the respective plate during operation, see FIG. 10. A second interlevel dielectric 314 is formed overlying the capacitor 302. The second interlevel dielectric 314 may be planarized to remove uneven topology to prepare for the formation of the heater 304.

The heater 304 is formed to have a serpentine shape as shown in FIG. 10. The cross section 9-9 through FIG. 10, shows parallel portions 316 of the heater 304 that wind over the capacitor 302. The heater 304 is formed from a conductive material that is patterned and etched into the serpentine shape. Once the heater 304 is formed, a third interlevel dielectric 318 is formed.

As described above, specific materials can be selected to constrain the heat generated by the heater 304 to the area immediately adjacent to the capacitor 302 and the heater 304. In one embodiment, the first and third interlevel dielectrics 312, 318 are low k materials that have a low thermal conductivity. The first and second conductive plates are aluminum and the second interlevel dielectric is silicon nitride. Since the silicon nitride spaces the heater 304 from the second plate 308 of the capacitor 302, the silicon nitride has a high k or high thermal conductivity to change the first dielectric constant of the dielectric layer 310 to the second dielectric constant. Arrows in FIG. 9 show how the specific materials can constrain the heat flow from the heater 304 to the dielectric layer 310.

The heater 304 generates heat as current passes through the heater 304 from a first contact 322 to a second contact 324. The temperature generated by the heater 304 is localized, i.e., the temperature generated does not extend past a distance 326 from an outer edge 328 of the heater 304. As shown in FIG. 9, a first portion 330 of the dielectric layer 310 is the first dielectric constant (the dielectric constant of the dielectric layer 310 upon deposition) and a second portion 332 is the second dielectric constant. The second portion 332 corresponds to the dielectric layer 310 that is within the distance 326 from the outer edges 328 of the heater 304. This distance 326 from inner edges 334 of the heater 304 overlap each other, which ensures that the second portion 332 of the dielectric layer 310 is changed from the first dielectric constant to the second dielectric constant.

Figure 11:
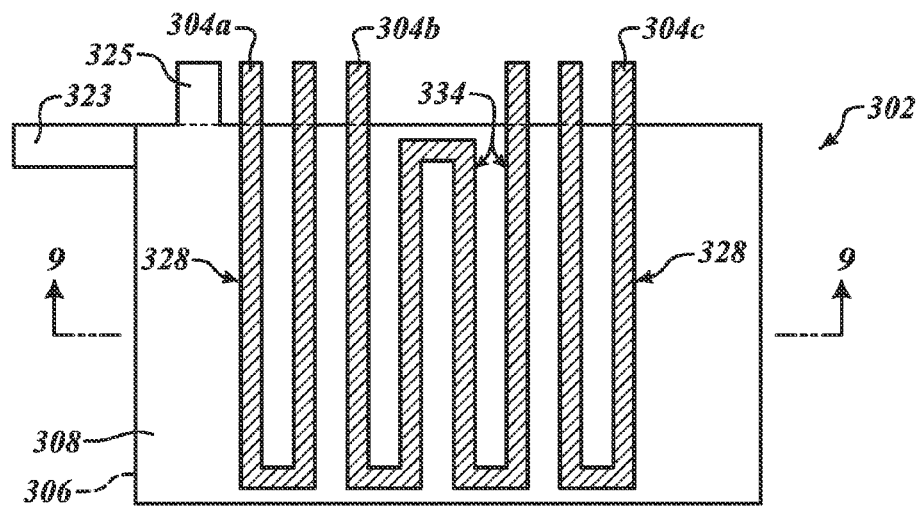
FIG. 11 is a top down view of the capacitor of FIG. 9 with three heaters according to another embodiment of the present disclosure.

FIGS. 8 and 10 show examples of a single heater covering the entire capacitor and the dielectric constant is changed a selected amount by controlled application of heat to the single heater. As an alternative, as shown in FIG. 11, two or more different heaters can be provided to heat selected portions of the dielectric. FIG. 11 includes three heaters 304a, 304b, 304c that can have different sizes to affect different size areas of the dielectric 310. The consumer can elect which one of the heaters 304a, 304b, 304c to activate in order to control the change in the dielectric constant in the dielectric layer 310. For example, the consumer or manufacturer could activate the first and third ones of the heaters 304a, 304c during a first thermal processing. The dielectric layer 310 would then have multiple portions of the second dielectric constant 332 that are separated by portions of the first dielectric constant 330. These portions of the first dielectric constant 330 are associated with the second one of the heaters 304b, which was not activated and thus did not heat the middle of the dielectric layer 310.

Figure 12:
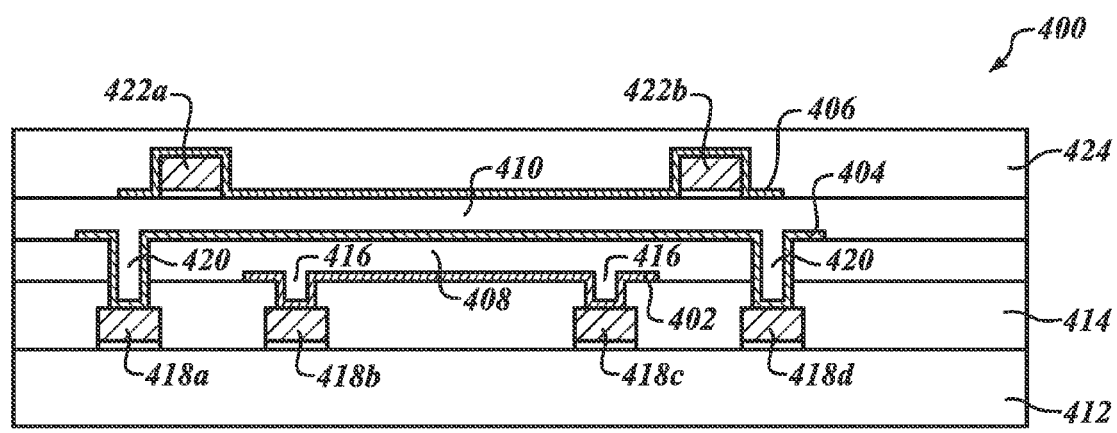
FIG. 12 is a cross-sectional view of an alternative configuration of a capacitor with an integrated heater according to another embodiment of the present disclosure.

FIG. 12 is an alternative embodiment of a device 400 having a capacitor and an integrated heater. In this embodiment, there are three conductive layers, a first conductive layer 402, a second conductive layer 404, and a third conductive layer 406. Each of the layers are formed from thin film materials, such as the ones described above with respect to FIG. 1. Each of the three layers are configured to act as the integrated heater and as plates of one or more capacitors. Various capacitances are achievable by selecting which layers are used for the capacitor and for the heater.

A first dielectric layer 408 separates the first and second conductive layers 402, 404 and a second dielectric layer 410 separates the second and third conductive layers 404, 406. The first, second, and third conductive layers 402, 404, 406 are formed over other active circuitry and components (not shown) of the device 400. A first interlevel dielectric 412 represents previously formed components of the device 400.

A plurality of first interconnect structures 418a-d are formed over the first interlevel dielectric 412 with techniques described above with respect to FIG. 1. A second interlevel dielectric 414 is formed over the first interconnect structures 418. Openings 416 are formed through the second interlevel dielectric 414 to reexpose second and third ones of the first interconnect structures 418b, 418c. The first conductive layer 402 is formed to couple to the second and third ones of the first interconnect structures 418b, 418c.

The first dielectric layer 408 is then formed. Openings 420 are formed through the first dielectric layer 408 and the second interlevel dielectric 414 to reexpose first and fourth ones of the first interconnect structures 418a, 418d. The second conductive layer 404 is formed to couple to the first and fourth ones of the first interconnect structures 418a, 418d.

The second dielectric layer 410 is formed over the second layer 404. Then a plurality of second interconnect structures 422a-b are formed on the second dielectric layer 410. The third conductive layer 406 couples to the second interconnect structures 422a-b. A third interlevel dielectric 424 is formed over the third conductive layer 422b.

The first, second, and third conductive plates 402, 404, 406 may be configured to achieve various temperature ranges, which will allow a variety of dielectric constants to be achieved. For example, in one embodiment the first and second conductive layers 402, 404 may act as plates of the capacitor and the third conductive layer 406 may act as the integrated heater. The third conductive layer 406 will heat the first dielectric layer 408 to a threshold temperature to change the dielectric layer 408 from a first dielectric constant to a second dielectric constant.

In an alternative embodiment, the second and third conductive layers 404, 406 are conductive plates of the capacitor and the first conductive layer 402 is configured to be the integrated heater. In addition, the capacitor may be formed from the first and the second conductive layers 402, 404 and the first conductive layer 402 may also be the integrated heater. The selection of which conductive layer is the heater and which ones are used for the capacitor may be selected by the consumer or other end user to create a precise capacitance from a wide variety of possible capacitances. The capacitor can be layers 402 and 404, 404 and 406, or 402 and 406, depending on the electrical connections made by various switching transistors, not shown but easily achievable by those of skill in the art. Alternatively, two capacitors can be formed using layers 402 and 404 as the first capacitor and layers 406 and 404 as the second capacitor, with the layer 404 being a common plate for two different capacitors.

Figure 13:
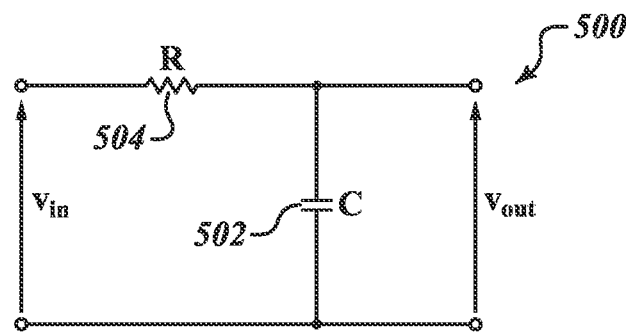
FIG. 13 is a circuit diagram of a low-pass filter that includes a capacitor formed in accordance with an embodiment of the present disclosure.

The capacitors described herein can be utilized in various filters, such as low pass, high pass, band pass, or band-stop filters, to name a few. FIG. 13 is a circuit diagram of a low pass filter 500 that includes a capacitor 502 formed in accordance with an embodiment of the present disclosure. The low pass filter 500 prevents frequencies above a cut off frequency from passing through the filter to an output Vout, i.e., the cutoff frequency is a boundary in the circuit's frequency response. The low pass filter 500 includes a resistor 504 in series with the capacitor 502, which is in parallel with the output Vout. The output Vout is highly sensitive to the value of the capacitor 502. Allowing a user to tune the value of the capacitor 502 to a precise capacitance will allow the user to have greater control of the output Vout and the frequency response of the circuit.

Figure 14:
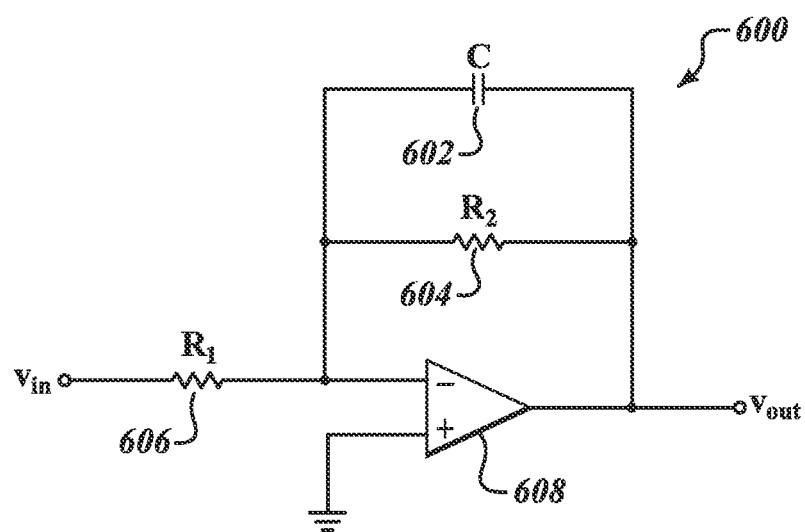
FIG. 14 is a circuit diagram of an active low-pass filter that includes a capacitor formed in accordance with an embodiment of the present disclosure.

FIG. 14 is a circuit diagram of an active low pass filter 600 that includes a capacitor 602 in parallel with a first resistor 604. A first node of the capacitor 602 and the resistor 604 is coupled to an input Vin through a second resistor 606. The first node is also coupled to an input of an operational amplifier 608, whose other input is coupled to ground. A second node of the capacitor 602 and the resistor 604 is coupled to an output Vout of the operational amplifier 608.

The output Vout is highly sensitive to a capacitance of the capacitor 602. Accordingly, a user will be able to precisely tune the frequency response of the low pass filter 600 by trimming the capacitor 602 to a precise capacitance in accordance with embodiments of the present disclosure. For example, a user may test the filter 600 to determine the frequency response of the filter. The user may then trim the capacitance of the capacitor 602 by heating the dielectric material to change the dielectric constant. Then the user will test the frequency response again. The user can repeat these test and trim steps until the desired frequency response is achieved.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
    an integrated circuit, including:
        a semiconductor substrate;
        a first transistor formed on the semiconductor substrate;
        a second transistor formed on the semiconductor substrate;
        an interlevel dielectric layer formed over the first transistor and the second transistor;
        a heater formed over the interlevel dielectric layer configured to generate a threshold temperature when the heater is activated;
        a first via formed over and coupled to the first transistor;
        a second via formed over and coupled to the second transistor;
        a first interconnect formed over and coupled to the first via;
        a second interconnect formed over and coupled to the second via; and
        a capacitor over the first transistor and the second transistor, the capacitor including:
            a first conductive plate formed over the interlevel dielectric layer, the first conductive plate being connected to the first interconnect;
            a first dielectric layer formed on the first conductive plate, a portion of the first dielectric layer being configured to change from a first dielectric constant to a second dielectric constant in response to the first dielectric layer being heated at or above the threshold temperature, after the heater is deactivated, the second dielectric constant remains different from the first dielectric constant; and
            a second conductive plate formed over the first dielectric layer, the second conductive plate being connected to the second interconnect.

2. The device of claim 1 wherein the capacitor is between the heater and the substrate.

3. The device of claim 1 wherein the heater is between the capacitor and the substrate.

4. The device of claim 1 wherein a length and a width of the portion of the first dielectric layer corresponds to a length and a width of the heater.

5. The device of claim 1 wherein the first dielectric layer has a first portion and a second portion, the first portion having the first dielectric constant and the second portion having the second dielectric constant.

6. The device of claim 5 wherein the second portion corresponds to dimensions of the first conductive plate.

7. The device of claim 1, wherein:
a top side of the first interconnect is covered by and connected to the first conductive plate;
a bottom side of the first interconnect is connected to the first via;
a top side of the second interconnect is covered by and connected to the second conductive plate;
a bottom side of the second interconnect is connected to the second via.

8. The device of claim 1, further comprising:
a third interconnect connected to the first conductive plate; and
a fourth interconnect connected to the second conductive plate.

9. The device of claim 8, wherein the first, second, third and fourth interconnects are formed in the first dielectric layer.

10. The device of claim 8, wherein the first and third interconnects are formed in the interlevel dielectric layer and the second and fourth interconnects are formed in the first dielectric layer.

11. The device of claim 8, wherein the first and third interconnects are formed in the first dielectric layer and the second and fourth interconnects are formed over the first dielectric layer.

12. The device of claim 8, wherein the first, second, third and fourth interconnects are formed in the interlevel dielectric layer.

13. The device of claim 8, wherein the first and second interconnect are formed in the interlevel dielectric layer, and the second and fourth interconnects are formed above the first dielectric layer.

14. The device of claim 8, wherein:
a top side, a first side and a second side of the first interconnect are covered by and connected to the first conductive plate;
a bottom side of the first interconnect is connected to the first via;
a top side, a first side and a second side of the second interconnect are covered by and connected to the second conductive plate; and
a bottom side of the second interconnect is connected to the second via.

15. A device, comprising:
an integrated circuit, including:
a substrate;
a first transistor formed on the substrate;
a second transistor formed on the substrate;
an interlevel dielectric layer formed on the substrate over the first transistor and the second transistor;
a first via coupled to the first transistor:
a second via coupled to the second transistor;
a first interconnect coupled to the first via;
a second interconnect coupled to the second via;
a capacitor over the first transistor and the second transistor, the capacitor including:
a first conductive plate formed over the interlevel dielectric layer, the first conductive plate being connected to the first interconnect;
a first dielectric layer formed on the first conductive plate, the first dielectric layer being configured to change from a first dielectric constant to a second dielectric constant in response to the first dielectric layer being heated at or above a threshold temperature; and
a second conductive plate over the first dielectric layer, the second conductive plate being connected to the second interconnect, one of the first conductive plate and the second conductive plate being configured to generate the threshold temperature to program a portion of the first dielectric layer from the first dielectric constant to the second dielectric constant, the second dielectric constant of the portion of the dielectric layer remaining different from the first dielectric constant when the integrated circuit is in powered on and is powered off.

16. The device of claim 15, further comprising a second dielectric layer over the capacitor and a heater over the second dielectric layer.

17. The device of claim 15 wherein the first dielectric layer has a first portion and a second portion, the first portion corresponding to the first dielectric constant and the second portion corresponding to the second dielectric constant.

18. The device of claim 17 wherein the second portion has an area that is aligned with an area of the first conductive plate.

19. A method, comprising:
forming a first transistor on a semiconductor substrate;
forming a second transistor on the semiconductor substrate;
forming an interlevel dielectric layer over the first transistor and the second transistor;
forming a first via in the interlevel dielectric layer;
coupling the first via to the first transistor;
forming a second via in the interlevel dielectric layer;
coupling the second via to the second transistor;
forming a first interconnect over the first via;
coupling the first interconnect to the first via;
forming a second interconnect over the second via;
coupling the second interconnect to the second via;
forming a first conductive plate over the first interconnect, the first conductive plate overlapping the first interconnect;
connecting the first conductive plate to the first interconnect;
forming a first dielectric layer over the first conductive plate, the first dielectric layer being configured to change from a first dielectric constant to a second dielectric constant in response to heat;
forming a second conductive plate over the first dielectric layer, the second conductive plate overlapping the second interconnect;
connecting the second conductive plate to the second interconnect; and
configuring one of the first conductive plate and the second conductive plate to generate heat to change the first dielectric layer from the first dielectric constant to the second dielectric constant.

20. The method of claim 19, further comprising forming a heater over the substrate, the heater being configured to heat the first dielectric layer to change the first dielectric constant to the second dielectric constant.

21. The method of claim 20, further comprising forming a second dielectric layer over the second conductive plate and wherein forming the heater includes forming the heater over the second dielectric layer.

22. The method of claim 19 wherein the first conductive plate is configured to heat the first dielectric layer to change the first dielectric constant to the second dielectric constant.

23. The method of claim 19, further comprising:
forming a first conductive layer over the interlevel dielectric layer;
forming the first conductive plate by removing portions of the first conductive layer;
forming a second conductive layer over the first dielectric layer; and
forming the second conductive plate by removing portions of the second conductive layer.

24. The method of claim 19, further comprising:
forming a first conductive layer over the interlevel dielectric layer;
forming the first dielectric layer over the first conductive layer;
forming a second conductive layer over the first dielectric layer, and
removing portions of the first conductive layer, the first dielectric layer, and the second conductive layer.

25. A method, comprising:
trimming a first capacitance of a capacitor to a second capacitance in an integrated circuit, the integrated circuit having a first transistor and a second transistor on a substrate, an interlevel dielectric layer over the first transistor and second transistor, a first via in the interlevel dielectric layer, the first via being coupled to the first transistor, a second via in the interlevel dielectric layer, the second via being coupled to the second transistor, the capacitor being over the first interlevel dielectric layer, the capacitor having a first conductive layer coupled to the first via, a second conductive layer coupled to the second via, and a dielectric layer between the first conductive layer and the second conductive layer, the trimming including:
changing a first dielectric constant of the dielectric layer to a second dielectric constant, the first dielectric constant corresponding to the first capacitance and the second dielectric constant corresponding to the second capacitance, the changing of the first dielectric constant including:
heating the dielectric layer above a threshold temperature for a selected time period by pulsing a current through one of the first conductive layer and the second conductive layer, the heating including activating one of the first transistor and the second transistor; and
changing a first portion of the dielectric layer to the second dielectric constant while leaving a second portion of the dielectric layer at the first dielectric constant, the first portion of the dielectric layer remaining at the second dielectric constant after the selected time period.

26. The method of claim 25 wherein the first conductive layer is configured to act as a heater and the heating of the dielectric layer includes passing current through the first conductive layer.

27. The method of claim 25 wherein the changing the first capacitance is performed after enclosing the capacitor in a package.

\* \* \* \* \*